(12) United States Patent
Alt

(10) Patent No.: US 11,698,413 B2
(45) Date of Patent: Jul. 11, 2023

(54) SELF-TEST CIRCUIT FOR AN INTEGRATED CIRCUIT, AND METHOD FOR OPERATING A SELF-TEST CIRCUIT FOR AN INTEGRATED CIRCUIT

(71) Applicant: Infineon Technologies AG, Neubiberg (DE)

(72) Inventor: Juergen Alt, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 17/480,249

(22) Filed: Sep. 21, 2021

(65) Prior Publication Data

US 2022/0107364 A1 Apr. 7, 2022

(30) Foreign Application Priority Data

Sep. 21, 2020 (DE) ...................... 10 2020 124 515.7

(51) Int. Cl.
*G01R 31/3185* (2006.01)
*G01R 31/3187* (2006.01)

(52) U.S. Cl.
CPC . *G01R 31/318558* (2013.01); *G01R 31/3187* (2013.01); *G01R 31/318536* (2013.01); *G01R 31/318597* (2013.01)

(58) Field of Classification Search
CPC .... G01R 31/318558; G01R 31/318536; G01R 31/318597; G01R 31/3187; G01R 31/31701; G01R 31/318544
See application file for complete search history.

(56) References Cited

U.S. PATENT DOCUMENTS

| | | | | |
|---|---|---|---|---|
| 6,829,740 B2* | 12/2004 | Rajski | ............ | G01R 31/318547 714/729 |
| 11,073,557 B2* | 7/2021 | Narayanan | ..... | G01R 31/318541 |
| 2002/0120894 A1* | 8/2002 | Heuts | ............. | G01R 31/318536 714/726 |

(Continued)

OTHER PUBLICATIONS

R. Cantoro, M. Palena, P. Pasini and M. S. Reorda, "Test Time Minimization in Reconfigurable Scan Networks," 2016 IEEE 25th Asian Test Symposium (ATS), Hiroshima, Japan, 2016, pp. 119-124. (Year: 2016).*

(Continued)

*Primary Examiner* — Cynthia Britt
(74) *Attorney, Agent, or Firm* — Eschweiler & Potashnik, LLC

(57) ABSTRACT

A self-test circuit for an integrated circuit, having a plurality of scan chains is provided, wherein each of the scan chains has a plurality of first memory elements, a data input for providing the scan chain with test data, wherein the data input is connected to one of the first memory elements, a plurality of second memory elements, and a switching apparatus having a first and a second switching position, which switching apparatus is coupled between the first memory elements and the second memory elements and is configured to respectively connect a last one of the first memory elements to a data output in the first switching position and to respectively connect the last one of the first memory elements to a first one of the second memory elements in the second switching position.

20 Claims, 6 Drawing Sheets

(56) References Cited

U.S. PATENT DOCUMENTS

| | | | |
|---|---|---|---|
| 2009/0070645 A1* | 3/2009 | Chiang | G01R 31/318558 |
| | | | 714/726 |
| 2015/0143190 A1 | 5/2015 | Mclaurin | |
| 2020/0182933 A1 | 6/2020 | Wu | |
| 2020/0271723 A1 | 8/2020 | Krenz-Baath | |

OTHER PUBLICATIONS

Wikipedia; "Sample and hold"; Web Article; https://en.wikipedia.org/wiki/Sample_and_hold ; Aug. 10, 2020.

* cited by examiner

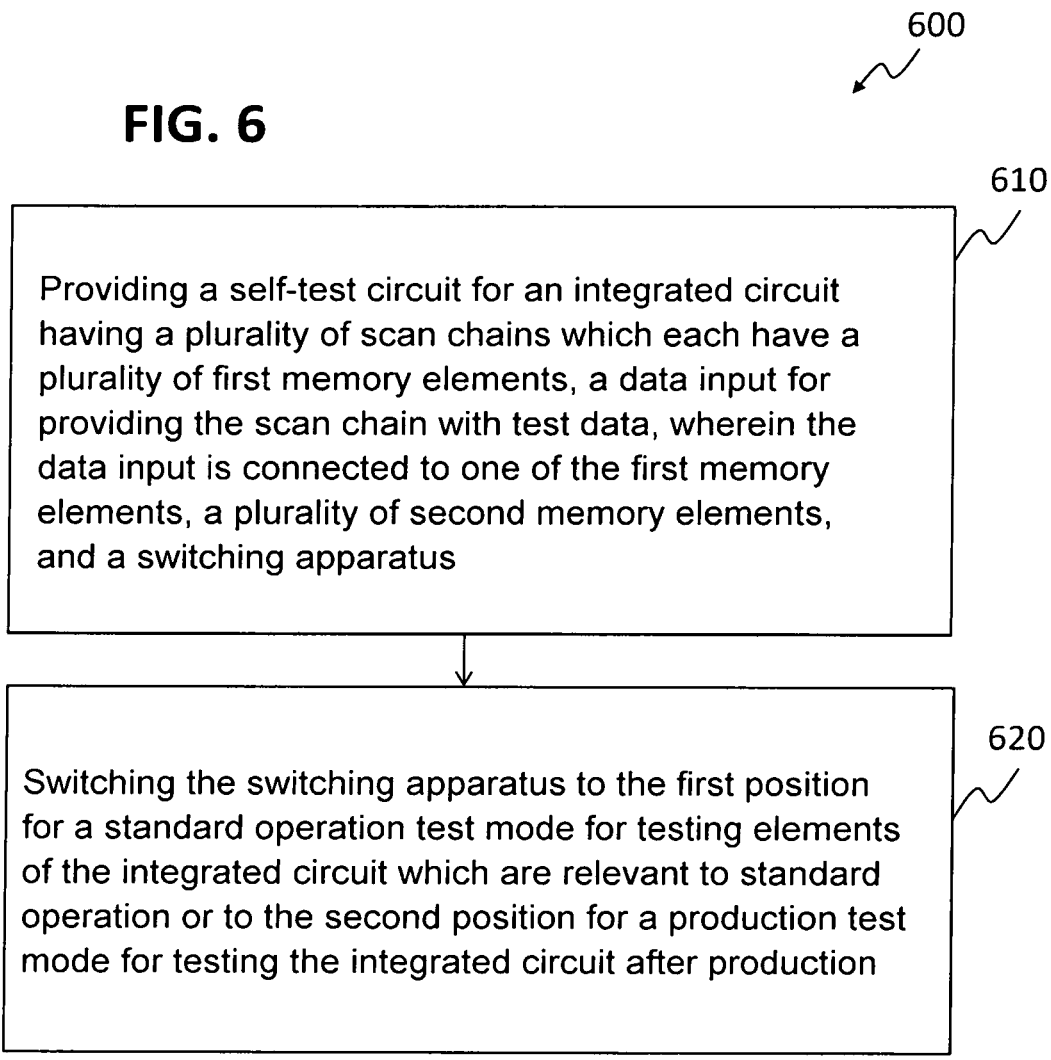

SELF-TEST CIRCUIT FOR AN INTEGRATED CIRCUIT, AND METHOD FOR OPERATING A SELF-TEST CIRCUIT FOR AN INTEGRATED CIRCUIT

REFERENCE TO RELATED APPLICATION

This application claims priority to German Application No. 10 2020 124 515.7, filed on Sep. 21, 2020, the contents of which are hereby incorporated by reference in their entirety.

DESCRIPTION

The disclosure relates to a self-test circuit for an integrated circuit and to a method for operating a self-test circuit for an integrated circuit.

An electronic system, in particular a safety-relevant electronic system, must be regularly tested for errors if it is intended to comply with standards for functional safety, for example ISO 26262 which is relevant to the automotive sector. Installed or integrated self-test circuits for detecting logic errors, also referred to as "Logic Built-In Self-Test" (LBIST), are currently conventional devices for performing such tests.

In the case of the tests, a distinction is made between so-called "key-on" tests and "key-off" tests.

In this case, tests which are performed, for example, during activation for normal operation, for example when switching on/starting up a system, for example when starting a vehicle, or during normal operation are referred to as "key-on" tests. The tests during activation are also referred to as "Power-On Self-Tests" (POST) and the tests during ongoing normal operation are referred to as "Mission-Mode LBIST".

In contrast, "key-off" tests are typically performed away from normal operation, for example for the purpose of quality assurance after producing the electronic system, whose part is the integrated circuit, or after deactivation on account of an error, for example.

Safety-relevant elements are typically tested by means of the "key-on" tests, whereas the systems tested by means of the "key-off" tests typically additionally contain non-safety-relevant elements.

LBIST is a structural approach. In contrast to functional approaches, for example software-based self-tests, LBIST is not performed within the system limits of the system to be tested or of the component to be tested, but rather is performed by means of an architecture specifically configured for this purpose, a so-called scan architecture.

A self-test circuit 100 for an integrated circuit is illustrated in FIG. 1.

The self-test circuit 100 typically has a plurality of scan chains 108, 114. Each of the scan chains may have a plurality of memory elements 110 and 112, for example flip-flops, which can be connected in series for each scan chain 108, 114. An additional compression logic unit (decompressor 102, compressor 104) is often also implemented as a so-called "Design-for-Test" measure.

In order to enable a "key-on" LBIST test inside an existing 'key-off' LBIST test device, it may be necessary to modify the scan or compression system.

This is because an acceptable period of time for performing the tests is considerably shorter for the "key-on" tests than for the "key-off" tests, for example only 5 ms for the "key-on" tests.

A performance duration for the "key-on" tests is typically shortened and brought below the predetermined limit by generating separate short scan chains 108 for the "key-on" tests, whereas the scan chains 114 which are used for the "key-off" tests are longer and are separated from the short scan chains 108.

The self-test circuit 100 may be configured such that, when performing the "key-on" test, the "key-off" scan chains 114 separated therefrom are not filled at all and can therefore not be used.

However, this may have a disadvantageous effect in two ways: it may be necessary to accordingly extend the "key-off" scan chains 114 for the purpose of balancing, for example because the total number of scan chains 108, 114 is restricted (for example on account of the configuration of the decompressor 102 and compressor 104), which extends a test duration for the "key-off" test, and/or the test duration may be kept the same or approximately the same. However, it may be necessary to dispense with some of the tests for this purpose. Alternatively, it is possible to use a combination of the two, dispensing with some tests in combination with a (less pronounced) extension of the "key-off" scan chains 114 and therefore the test time.

Various exemplary embodiments provide a self-test circuit for an integrated circuit, which self-test circuit makes it possible to shorten a performance duration for the "key-off" test (despite the same or a larger number of tests than in some other approaches) and to nevertheless provide a "key-on" test which can be performed within a predetermined maximum period of time, for example within 5 ms.

In various exemplary embodiments, the self-test circuit may have a plurality of scan chains, each scan chain of which has both memory elements for the "key-on" test and memory elements for the "key-off" test, and all scan chains have approximately the same length.

In various exemplary embodiments, each scan chain of the plurality of scan chains may be configured such that a plurality of first memory elements (for the "key-on" test) are arranged at the start of each scan chain (that is to say on the input side) and a plurality of second memory elements (which are used only during the "key-off" test) are arranged after the first memory elements. A switch may be arranged between the first memory elements and the second memory elements and may be changed over between a first switching position, in which the last one of the first memory elements is connected to a data output, and a second switching position, in which the last one of the first memory elements is connected to the first one of the second memory elements.

Described clearly, the switch can be used to provide a shortcut which enables data evaluation after passing through the first memory elements. This can be used to enable evaluation of the (for example safety-relevant) tests (for example the "key-on" test or more generally all tests for which a short test duration is essential), which can be performed by means of the first memory elements, within a short time.

If the switch is changed to the second switching position, the complete scan chain can be filled with test data and evaluated, for example as part of a "key-off" test. Since the memory elements are now uniformly distributed among all scan chains, a minimum test duration can be achieved and the time needed for tests after production can therefore be shortened, for example.

In various exemplary embodiments, the self-test circuit may also have logic circuit which may be configured to combine output data, which are output by the last ones of the first memory elements, in pairs. The logic circuit may have XOR or XNOR gates, for example.

In various exemplary embodiments, the output data (that is to say the processed test data) can be supplied to a memory, for example a linear feedback shift register (LFSR, for example a multiple input signature register, MISR 106 in FIG. 1), which can be configured or used to examine the output response. Both the output data which are output after the first memory elements and the output data which are output after the second memory elements can be supplied to the memory.

BRIEF DESCRIPTION OF THE DRAWINGS

Exemplary embodiments of the disclosure are illustrated in the figures and are explained in more detail below.

FIG. 6 shows a flowchart of a method for operating a self-test circuit for an integrated circuit according to various exemplary embodiments.

DETAILED DESCRIPTION

Figure 1:
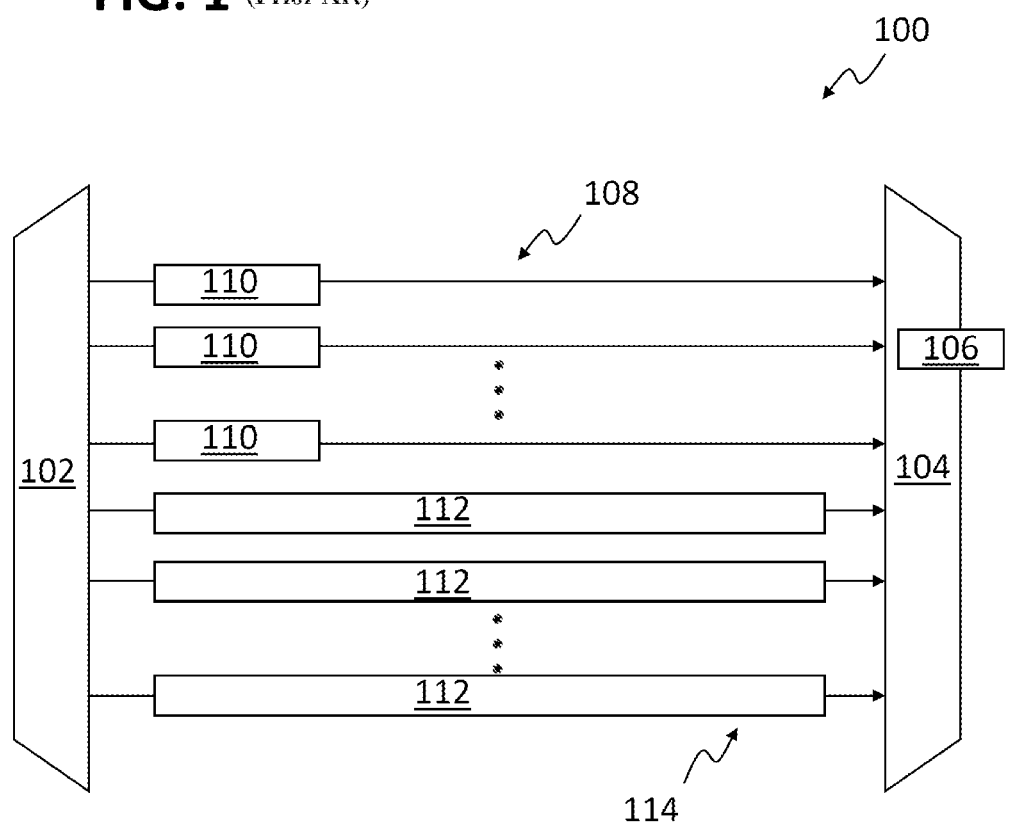
FIG. 1 shows a schematic illustration of a self-test circuit for an integrated circuit.
Figure 2:
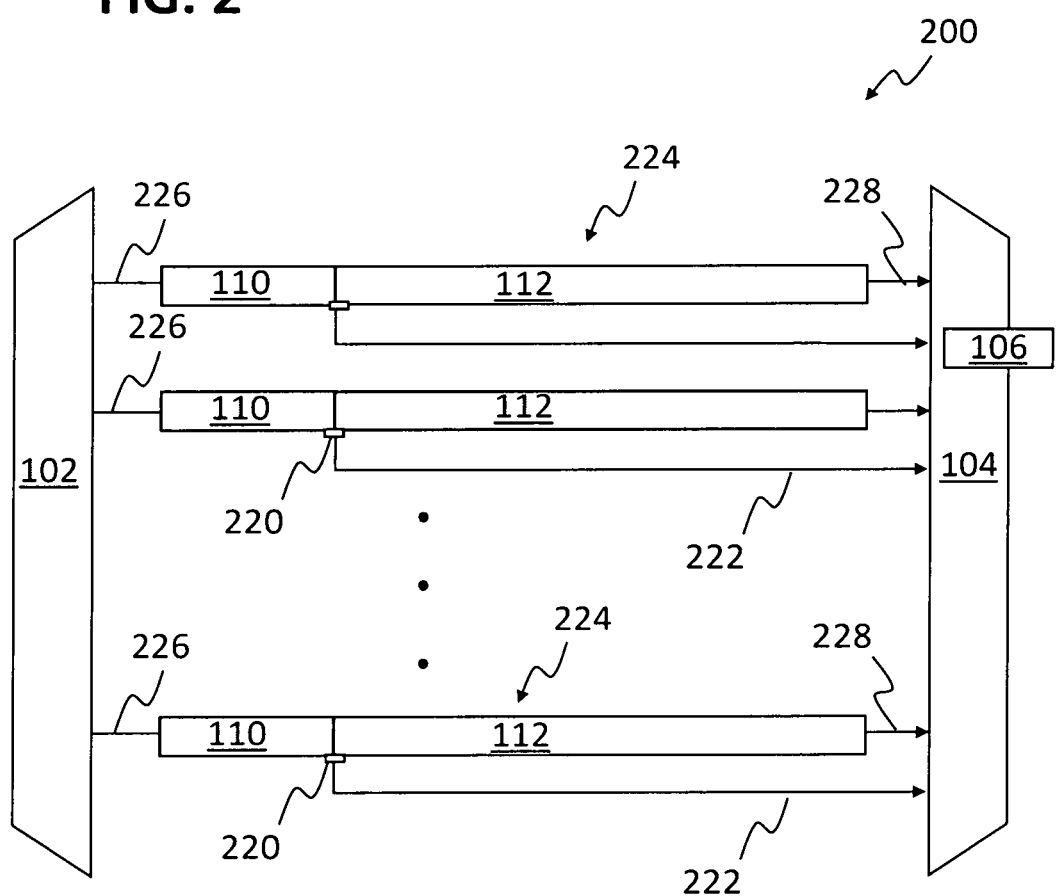
FIG. 2 shows a schematic illustration of a self-test circuit for an integrated circuit according to various exemplary embodiments.

In the following detailed description, reference is made to the accompanying drawings, which form part of this application and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 2 to FIG. 5 each show a schematic illustration of a self-test circuit 200 for an integrated circuit according to various exemplary embodiments.

During normal operation of an integrated circuit (of which only those elements which are also simultaneously part of the self-test circuit 200 are illustrated), also referred to as working mode, functional mode or function mode, memory elements 110, 112 can store data values and logic circuits (not illustrated) can carry out combinational logic using the data values, for example using Boolean operators.

For a self-test, the memory elements 110, 112 can be preloaded with test data for better controllability during the test. For preloading, the memory elements 110, 112 may have been or are coupled in a series circuit to form scan chains.

A test cycle (here an LBIST cycle) may have three stages. First of all, the test data, for example pseudorandom numbers, are loaded, for example pushed, into the memory elements 110 or into the memory elements 110 and 112 (the two alternatives are explained in more detail below). This is carried out along the scan chains 224.

In a second stage, the test data are processed by a logic circuit to be tested (which models or implements combinational logic, for example), which results in possible errors, which propagate through the logic circuit, being detected and stored in a memory 106.

In a third stage, the processed test data are pushed from the memory elements 110 or 112 of the scan chain 224 into another memory element 110 or 112.

The scan chains 224 and the corresponding LBIST method are usually created such that the third stage of a test cycle is simultaneously the first stage of a subsequent test cycle. In other words, the test data processed and output by one of the logic circuits may form the input data for the subsequent logic circuit along the scan chain 224 in the subsequent test cycle.

The self-test circuit 200 may have a plurality of scan chains 224, each of which may have a plurality of first memory elements 110 and a plurality of second memory elements 112.

Each of the first memory elements 110 and each of the second memory elements 112 may have at least one flip-flop, typically a plurality of flip-flops, or other memory elements, for example latches, in various exemplary embodiments.

In various exemplary embodiments, each of the scan chains 224 may be configured such that the plurality of first memory elements 110 are provided at the start of each scan chain 224 and the plurality of second memory elements 112 are provided after the first memory elements.

In other words, the first memory elements 110 may be arranged on the input side and the second memory elements 112 may be arranged on the output side in each of the scan chains 224.

In other words, in various exemplary embodiments, a test scheme is provided for a self-test, in which the scan chains 224 are configured such that the first memory elements 110 (for example the flip-flops for testing safety-relevant systems), which are used for the "key-on" LBIST, are distributed over all scan chains 224 of a plurality of scan chains 224 and are arranged at the respective start of the scan chains 224.

In each of the scan chains 224, a first one of the first memory elements 110 may be coupled, for example connected, to a data input 226. A last one of the second memory elements 112 may be coupled, for example connected, to a (second) data output 228.

In each of the scan chains 224, a last one of the first memory elements 110 can be connectable, by means of a switch 220, either—in a first switching position—to a (first) data output 222 or—in a second switching position—to a first one of the second memory elements 112.

The plurality of switches 220 may together form a switching apparatus. All switches 220 of the self-test circuit 200 may be configured such that they are all in a position corresponding to the first switching position or all switches are in a position corresponding to the second switching position.

At the data input 226, the self-test circuit 200 may also have a decompressor 102 for decompressing the test data.

At the data output 228, the self-test circuit 200 may also have a compressor 104 for compressing the processed test data (also referred to as output data).

The decompressor 102 and the compressor 104 may together form a compression logic unit 102, 104.

Figure 3:
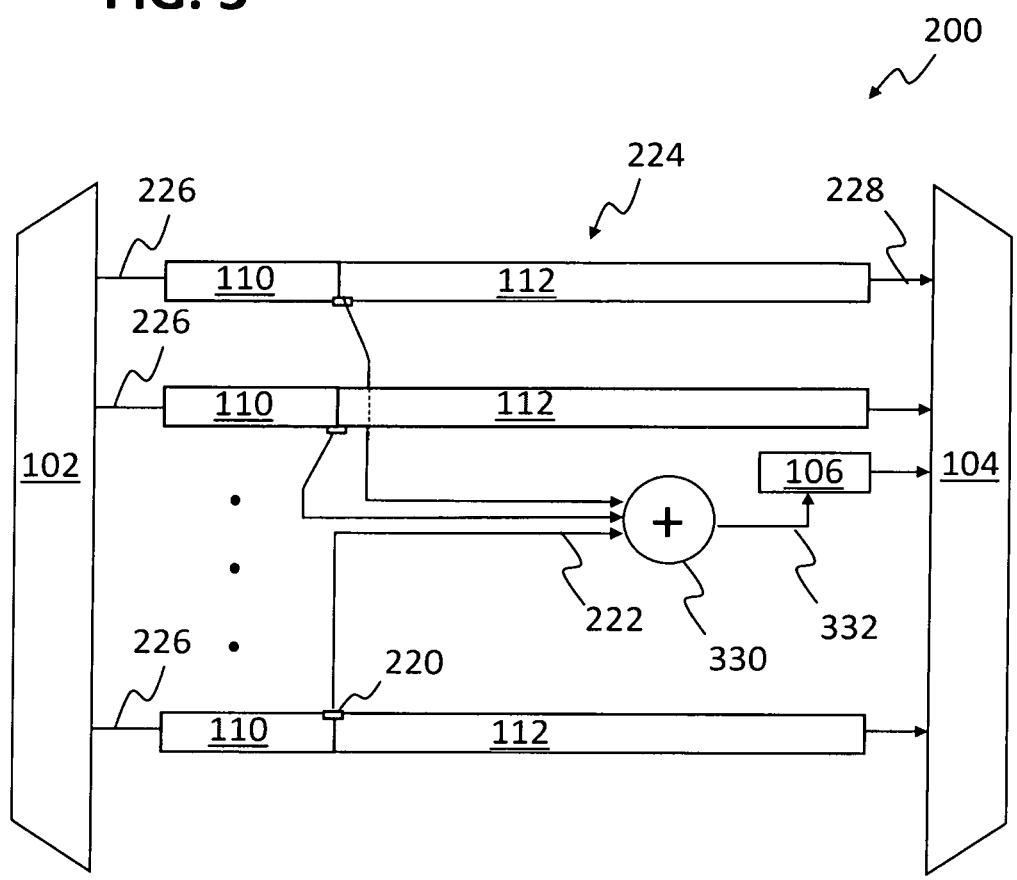
FIG. 3 shows a schematic illustration of a self-test circuit for an integrated circuit according to various exemplary embodiments.
Figure 4:
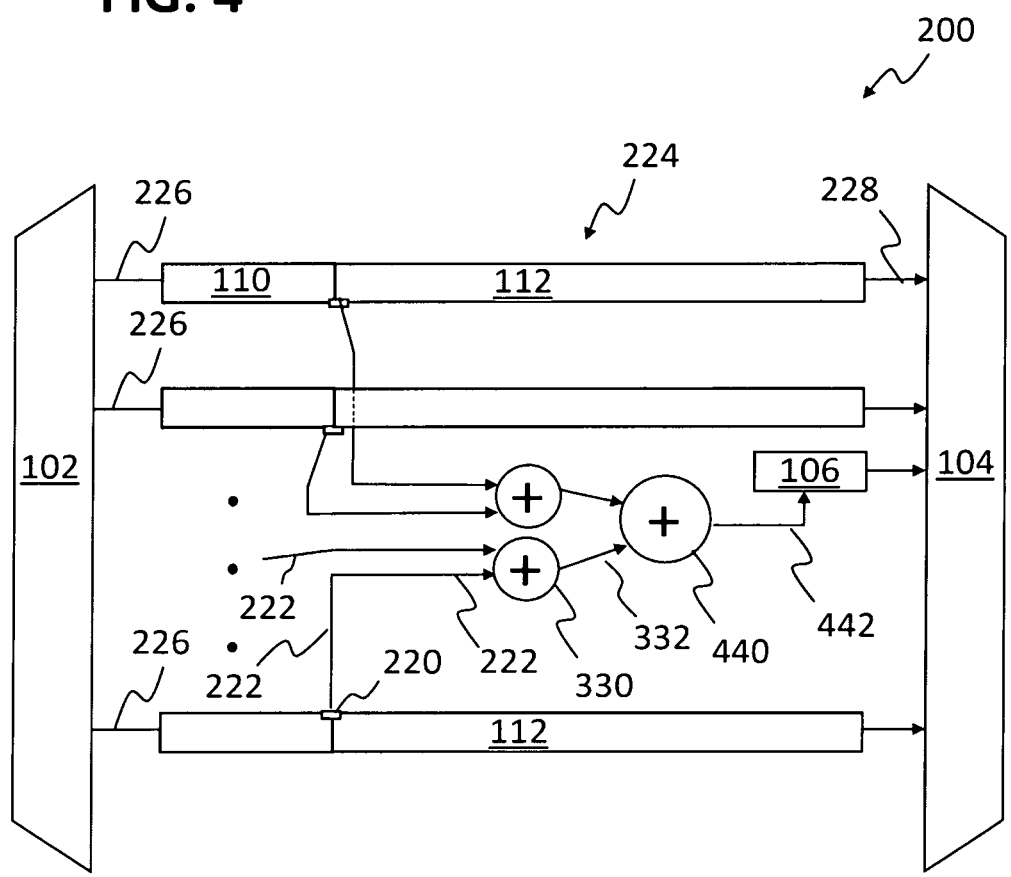
FIG. 4 shows a schematic illustration of a self-test circuit for an integrated circuit according to various exemplary embodiments.
Figure 5:
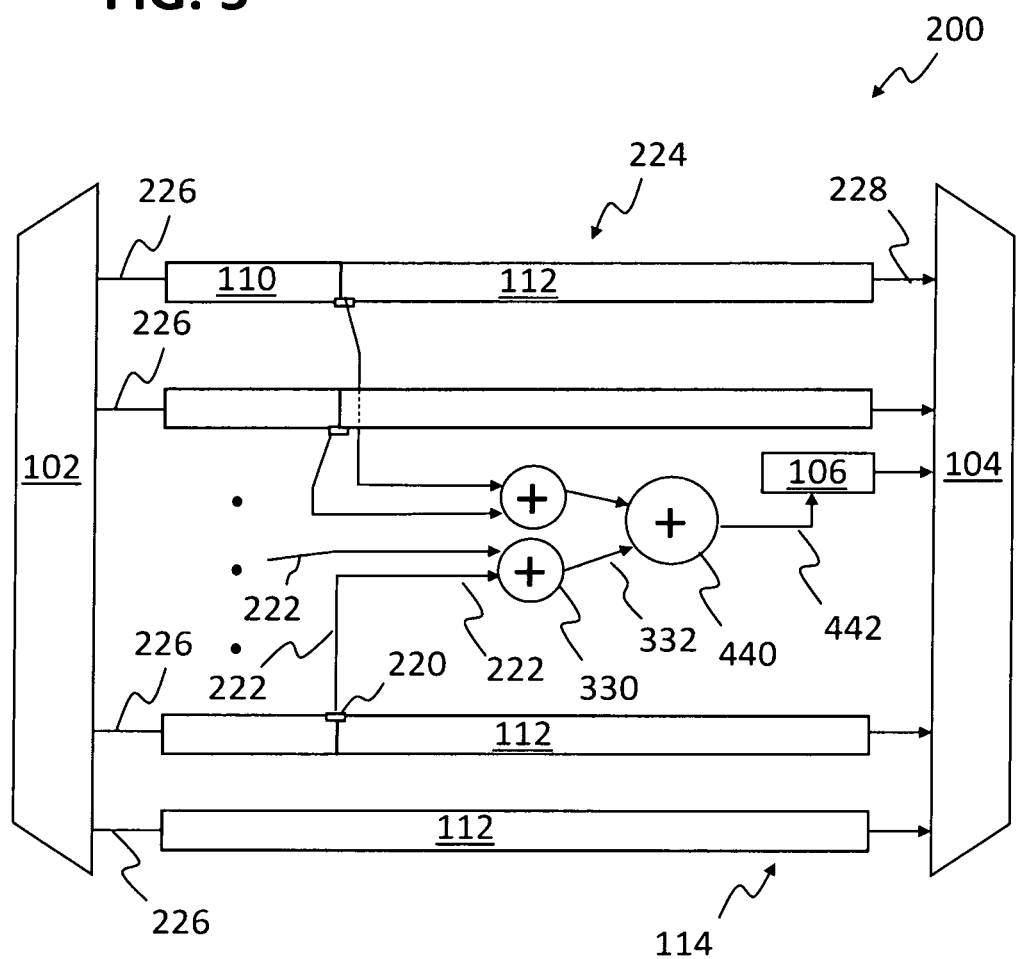
FIG. 5 shows a schematic illustration of a self-test circuit for an integrated circuit according to various exemplary embodiments.

In various exemplary embodiments, the output data may be supplied to a memory 106, for example a linear feedback shift register (LFSR, possibly with multiple input, MISR). The memory 106 may be formed, for example, as part of the compressor 104 (this is illustrated, by way of example, in FIG. 2). Alternatively or additionally (then in the form of a two-part or multi-part memory, for example), the memory 106 may be formed separately from the compressor 104 and may be coupled between the data output 222 or 228 and the compressor 104. FIGS. 3, 4 and 5 illustrate, by way of example, a memory 106 which is coupled between the first data output 222 and the compressor 104. In various exemplary embodiments, the compressor 104 may have an (additional) memory 106.

Both the output data which are output after the first memory elements 110, for example by means of the first data output 222, and the output data which are output after the second memory elements 112, for example by means of the second data output 228, may be supplied to the memory 106.

The self-test circuit 200 may be configured such that it is operable in a normal operation test mode for testing elements of the integrated circuit which are relevant to normal operation.

In the normal operation test mode, the switching apparatus may be in the first switching position.

In the normal operation test mode, the first memory elements 110 may be configured to provide the test data as operation test data for the normal operation test.

In various exemplary embodiments, a number of the first memory elements 110 may be considerably smaller than a number of the second memory elements 112 or generally less than or at most just as large as the number of second memory elements 112.

The number of scan chains may be several thousand. Of these, a few percent with a length of a few dozen in each case are flip-flops, for example, and the rest are non-safety-relevant flip-flop scan chains 112, the length of which varies from a few dozen to 100, for example. This means that some flip-flops can be used for a "key-on" test and approximately ten times as many can be used for a "key-off" test.

Accordingly, in various exemplary embodiments, the number of first memory elements 110 may be at most 80% of the number of second memory elements 112, for example at most 60%, for example at most 40%, for example at most 20%, for example at most 10%, for example at most 5%.

In various exemplary embodiments, the number of first memory elements 112 may be selected such that a maximum performance duration of a self-test using only the first memory elements 110 (which can be used for the "key-on" self-test) is or does not exceed 10 ms, for example 5 ms, for example 4 ms, for example 3 ms.

In addition, the number of first memory elements 110 may vary only slightly from scan chain 224 to scan chain 224. In other words, a number of the first memory elements 110 in each of the scan chains 224 differs by at most 10%, for example at most 5%, from an arithmetic mean of the numbers of first memory elements 110 for each scan chain 224, and is optionally the same. With a uniform distribution of the first memory elements 110 among the scan chains 224, a minimum performance duration for the self-test can be achieved by means of the first memory elements 110 since the self-test is completely concluded only when all scan chains 224 have been processed. An individual excessively long scan chain 224 can therefore extend the overall performance duration, which is avoided if the number of first memory elements 110 is approximately the same in all scan chains 224. This is illustrated, by way of example, in FIGS. 2, 3 and 4.

In various exemplary embodiments, the number of second memory elements 112 in all scan chains 224 taken together may exceed the number of first memory elements 110 in all scan chains 224 taken together to such an extent that only a maximum number of scan chains 224 with the first memory elements 110 can be provided, for example as the memory elements 110 with a predetermined minimum length are to be provided. In the situation illustrated, by way of example, in FIG. 5, additional scan chains 114 which have only the second memory elements 112 can be provided. In that case, the self-test circuit 200 may be configured such that the second memory elements 112 of the scan chains 114 are filled with test data only when the second memory elements 112 of the scan chains 224 are also filled with test data.

Described clearly, the switch 220 can be used to provide a shortcut which enables data evaluation after passing through the first memory elements 110. The processed test data are then provided at the respective data outputs 222 in each of the scan chains 224.

This can be used to enable evaluation of the (for example safety-relevant) tests (for example the "key-on" test or more generally all tests for which a short test duration is essential), which can be performed by means of the first memory elements 110, within a short time.

According to various exemplary embodiments, the self-test circuit 200 may also be operable in a production test mode, for example after production of the integrated circuit, in which mode the switching apparatus is in the second switching position.

This means that the test data can be loaded both into the first memory elements 110 and into the second memory elements 112. This makes it possible to provide the test data as production test data for the production test, that is to say, for example, to provide the test data for all tests which need to be performed as the completion of production.

In various exemplary embodiments, total lengths of the scan chains 224 (and possibly also of the additional scan chains 114) may be approximately the same. In other words, a sum of a number of the first memory elements 110 and a number of the second memory elements 112 in each of the scan chains 224 may differ by at most 10%, for example by at most 5%, from an arithmetic mean of the sums of first and second memory elements for each scan chain 224, and may optionally be the same.

In addition, in various exemplary embodiments (see FIG. 5), a number of the second memory elements 112 in each of the scan chains 114 may differ by at most 10%, for example by at most 5%, from an arithmetic mean of the sums of first and second memory elements for each scan chain 224, and may optionally be the same.

According to various exemplary embodiments, the self-test circuit 200 may also have a logic circuit 330 which may be coupled to the data outputs 222 and may be configured to logically combine in pairs output data from the respective last one of the first memory elements 110, for example an XOR circuit or an XNOR circuit. This is shown, by way of example, in FIG. 3.

A data output from the logic circuit 330 may be transferred to the memory 106 for evaluation. Alternatively, the data output from the logic circuit may be effected to an additional logic circuit 440 which is coupled to the logic circuit 330 and may be configured to logically combine in pairs the output data from the logic circuit 330 which have been logically combined in pairs.

The additional logic circuit 440 may likewise have or be composed of an XOR circuit or an XNOR circuit. A corresponding exemplary embodiment is illustrated in FIGS. 4 and 5.

If the switch is changed to the second switching position, the complete scan chain can be filled with test data and evaluated, for example as part of a "key-off" test. Since the memory elements are now uniformly distributed among all scan chains, a minimum test duration can be achieved and the time which is needed for tests after production, for example, can therefore be shortened.

As already indicated above, each last one of the first memory elements 110 may be connected to the memory 106 (for example a 32 bit MISR module). 32 data input channels may be provided on the MISR. More than 32 scan chains are typically available.

In such a case, the logic circuit 330 may be provided and possibly a further logic circuit 440 (see FIGS. 3, 4, 5) in order to compress the data outputs from the first memory elements 110 to the number of memory input channels which may be 32, for example.

A single-stage logic circuit, for example a single-stage XOR tree, may make it possible to compress 64 memory elements to the available 32 filter inputs, and the further logic circuit 440 may make it possible to compress 256 outputs to the 32 filter inputs.

In various exemplary embodiments, the logic circuit 330 or 440 may be substantially the only additional circuit component in comparison with the self-test circuit 100 from FIG. 1.

In various exemplary embodiments, a balanced self-test circuit 200 is provided.

The configuration according to various exemplary embodiments may make it possible to dispense with rules with respect to short LBIST scan chains 224. In other words, a number and a length of scan chains 224 for a scan/compression system (that is to say the self-test circuit 200) can be defined independently of a "key-on" LBIST requirement.

FIG. 6 shows a flowchart 600 of a method for operating a self-test circuit for an integrated circuit.

The method comprises providing a self-test circuit for the integrated circuit having a plurality of scan chains, wherein the scan chains each have a plurality of first memory elements, a data input for providing the scan chain with test data, wherein the data input is connected to one of the first memory elements, a plurality of second memory elements, and a switching apparatus (at 610), and switching the switching apparatus to the first position for a normal operation test mode for testing elements of the integrated circuit which are relevant to normal operation or to the second position for a production test mode for testing the integrated circuit after production (at 620).

Some exemplary embodiments are stated in summary below.

Exemplary embodiment 1 is a self-test circuit for an integrated circuit, having a plurality of scan chains, wherein each of the scan chains has a plurality of first memory elements, a data input for providing the scan chain with test data, wherein the data input is connected to one of the first memory elements, a plurality of second memory elements, and a switching apparatus having a first and a second switching position, which switching apparatus is coupled between the first memory elements and the second memory elements and is configured to respectively connect a last one of the first memory elements to a data output in the first switching position and to respectively connect the last one of the first memory elements to a first one of the second memory elements in the second switching position.

Exemplary embodiment 2 is a self-test circuit according to exemplary embodiment 1, which is operable in a normal operation test mode for testing elements of the integrated circuit which are relevant to normal operation, in which mode the switching apparatus is in the first switching position.

Exemplary embodiment 3 is a self-test circuit according to exemplary embodiment 2, wherein the first memory elements are configured to provide the test data as operation test data for the normal operation test.

Exemplary embodiment 4 is a self-test circuit according to one of exemplary embodiments 1 to 3, which is operable in a production test mode following production of the integrated circuit, in which mode the switching apparatus is in the second switching position.

Exemplary embodiment 5 is a self-test circuit according to exemplary embodiment 4, wherein the first and second memory elements are configured to provide the test data as production test data for the production test.

Exemplary embodiment 6 is a self-test circuit according to one of exemplary embodiments 1 to 5, wherein a number of the first memory elements in each of the scan chains differs by at most 10% from an arithmetic mean of the numbers of first memory elements for each scan chain, and is optionally the same.

Exemplary embodiment 7 is a self-test circuit according to one of exemplary embodiments 1 to 6, wherein a sum of a number of the first memory elements and a number of the second memory elements in each of the scan chains differs by at most 10% from an arithmetic mean of the sums of first and second memory elements for each scan chain, and is optionally the same.

Exemplary embodiment 8 is a self-test circuit according to exemplary embodiment 2 or 3, wherein a number of the first memory elements in each of the scan chains is less than or equal to a predetermined limit value which corresponds to a predetermined maximum performance duration for the normal operation test.

Exemplary embodiment 9 is a self-test circuit according to exemplary embodiment 8, wherein the maximum performance duration is 10 ms.

Exemplary embodiment 10 is a self-test circuit according to one of exemplary embodiments 1 to 9, wherein a number of the first memory elements is less than or equal to a number of the second memory elements in each of the scan chains.

Exemplary embodiment 11 is a self-test circuit according to one of exemplary embodiments 1 to 10, wherein at least one of the first memory elements and/or at least one of the second memory elements has/have a flip-flop.

Exemplary embodiment 12 is a self-test circuit according to one of exemplary embodiments 1 to 11, which also has a logic circuit which is coupled to the data outputs and is configured to logically combine in pairs output data from the respective last ones of the first memory elements.

Exemplary embodiment 13 is a self-test circuit according to exemplary embodiment 12, which also has an additional logic circuit which is coupled to the logic circuit and is configured to logically combine in pairs the output data from the logic circuit which have been logically combined in pairs.

Exemplary embodiment 14 is a self-test circuit according to exemplary embodiment 12 or 13, wherein the logic circuit has or is composed of an XOR circuit or an XNOR circuit.

Exemplary embodiment 15 is a self-test circuit according to one of exemplary embodiments 1 to 14, wherein the switching apparatus has a plurality of switches, one switch of which for each scan chain is respectively coupled between the first memory elements and the second memory elements of the scan chain, and the switches are configured such that all switches are in a position corresponding to the first switching position or all switches are in a position corresponding to the second switching position.

Exemplary embodiment 16 is a method for operating a self-test circuit according to one of exemplary embodiments 1 to 15. The method comprises switching the switching apparatus to the first position for a normal operation test mode for testing elements of the integrated circuit which are relevant to normal operation or to the second position for a production test mode for testing the integrated circuit following production.

Exemplary embodiment 17 is a method according to exemplary embodiment 16, which also comprises loading operation test data into the first memory elements if the switching apparatus is in the first switching position, or loading production test data into the first memory elements and into the second memory elements if the switching apparatus is in the second switching position.

Exemplary embodiment 18 is a method according to exemplary embodiment 17, which also comprises evaluating output data which are made available to the data output by the respective last one of the first memory elements if the switching apparatus is in the first switching position, or evaluating output data which are made available to a further data output by the respective last one of the second memory elements if the switching apparatus is in the second switching position.

Exemplary embodiment 19 is a method according to exemplary embodiment 18, which also comprises logically combining in pairs the output data from the respective last ones of the first memory elements before evaluation if the switching apparatus is in the first switching position.

Exemplary embodiment 20 is a method according to exemplary embodiment 19, wherein the logic combination in pairs comprises an XOR combination or an XNOR combination.

Further advantageous configurations of the apparatus emerge from the description of the method and vice versa.

The invention claimed is:

1. A self-test circuit for an integrated circuit, comprising:
a plurality of scan chains, each scan chain comprising:
a plurality of first memory elements;
a data input for providing the scan chain with test data, wherein the data input is connected to one of the first memory elements of the scan chain;
a plurality of second memory elements;
a switching apparatus having a first switching position and a second switching position, the switching apparatus being coupled between the first memory elements and the second memory elements, and the switching apparatus being configured, when the integrated circuit is in a first mode, to connect a last one of the first memory elements to a data output in the first switching position and configured, when the integrated circuit is in a second mode, to connect the last one of the first memory elements to a first one of the second memory elements in the second switching position; and
a logic circuit which is coupled to the data outputs of the plurality of scan chains, wherein the logic circuit is configured to logically combine output data from only the first memory elements of the plurality of scan chains.

2. The self-test circuit as claimed in claim 1, the self-test circuit being operable in a normal operation test mode for testing elements of the integrated circuit which are relevant to normal operation, wherein the switching apparatus is in the first switching position during the normal operation test mode.

3. The self-test circuit as claimed in claim 2, wherein the first memory elements are configured to provide the test data as operation test data for the normal operation test mode.

4. The self-test circuit as claimed in claim 2, wherein a number of the first memory elements in each of the scan chains is less than or equal to a predetermined limit value which corresponds to a predetermined maximum performance duration for the normal operation test mode.

5. The self-test circuit as claimed in claim 4, wherein the predetermined maximum performance duration is 10 ms.

6. The self-test circuit as claimed in claim 1, the self-test circuit being operable in a production test mode following production of the integrated circuit, wherein the switching apparatus is in the second switching position during the production test mode.

7. The self-test circuit as claimed in claim 6, wherein the first and second memory elements are configured to provide the test data as production test data for the production test mode.

8. The self-test circuit as claimed in claim 1, wherein a number of the first memory elements in each of the scan chains differs by at most 10% from an arithmetic mean of the numbers of first memory elements for each scan chain, or is the same as the arithmetic mean of the numbers of first memory elements for each scan chain.

9. The self-test circuit as claimed in claim 1, wherein a sum of a number of the first memory elements and a number of the second memory elements in each of the scan chains differs by at most 10% from an arithmetic mean of the sums of first and second memory elements for each scan chain, or is optionally the same as the arithmetic mean of the sums of the first and second memory elements for each scan chain.

10. The self-test circuit as claimed in claim 1, wherein a number of the first memory elements is less than or equal to a number of the second memory elements in each of the scan chains.

11. The self-test circuit as claimed in claim 1, wherein at least one of the first memory elements and/or at least one of the second memory elements has/have a flip-flop.

12. The self-test circuit as claimed in claim 1, further comprising:
an additional logic circuit which is coupled to the logic circuit and is configured to logically combine in pairs the output data from the logic circuit which have been logically combined in pairs.

13. The self-test circuit as claimed in claim 12, wherein the logic circuit has or is composed of an XOR circuit or an XNOR circuit.

14. The self-test circuit as claimed in claim 1, wherein the switching apparatus has a plurality of switches, one switch of which for each scan chain is respectively coupled between the first memory elements and the second memory elements of the scan chain, and the switches are configured such that all switches are in a first position corresponding to the first switching position or all switches are in a second position corresponding to the second switching position.

15. A method for operating the self-test circuit as claimed in claim 1, the method comprising:
switching the switching apparatus to the first switching position for a normal operation test mode for testing elements of the integrated circuit which are relevant to normal operation or to the second switching position for a production test mode for testing the integrated circuit following production.

16. The method as claimed in claim 15, further comprising:
loading operation test data into the first memory elements when the switching apparatus is in the first switching position, or
loading production test data into the first memory elements and into the second memory elements when the switching apparatus is in the second switching position.

17. The method as claimed in claim 16, further comprising:
evaluating output data which are made available to the data output by the last one of the first memory elements when the switching apparatus is in the first switching position, or
evaluating output data which are made available to a further data output by the last one of the second memory elements when the switching apparatus is in the second switching position.

18. The method as claimed in claim 17, further comprising:
logically combining in pairs the output data from the last ones of the first memory elements before the evaluating of the output data.

19. The method as claimed in claim 18, wherein the logically combining in pairs comprises an XOR combination or an XNOR combination.

20. The self-test circuit as claimed in claim 1, wherein the first mode comprises a key-on test having a first testing duration and the second mode comprises a key-off test having a second testing duration, the second testing duration being greater than the first testing duration.

* * * * *